(12) United States Patent
Cheng et al.

(10) Patent No.: US 10,170,618 B2
(45) Date of Patent: Jan. 1, 2019

(54) VERTICAL TRANSISTOR WITH REDUCED GATE-INDUCED-DRAIN-LEAKAGE CURRENT

(71) Applicant: INTERNATIONAL BUSINESS MACHINES CORPORATION, Armonk, NY (US)

(72) Inventors: Kangguo Cheng, Schenectady, NY (US); Xin Miao, Guilderland, NY (US); Peng Xu, Guilderland, NY (US); Chen Zhang, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/448,047

(22) Filed: Mar. 2, 2017

(65) Prior Publication Data

US 2018/0254344 A1 Sep. 6, 2018

(51) Int. Cl.
*H01L 29/00* (2006.01)
*H01L 29/78* (2006.01)
*H01L 29/66* (2006.01)
*H01L 21/8234* (2006.01)
*H01L 29/08* (2006.01)
(Continued)

(52) U.S. Cl.
CPC .... *H01L 29/7827* (2013.01); *H01L 21/02532* (2013.01); *H01L 21/823412* (2013.01); *H01L 21/823487* (2013.01); *H01L 27/088* (2013.01); *H01L 29/0847* (2013.01); *H01L 29/1037* (2013.01); *H01L 29/165* (2013.01);
(Continued)

(58) Field of Classification Search
CPC ............... H01L 29/7845; H01L 29/785; H01L 29/66795; H01L 29/41791; H01L 29/0649; H01L 29/66553; H01L 21/823814; H01L 21/823885; H01L 21/823828; H01L 21/823871; H01L 21/28518; H01L 21/823412; H01L 29/66666; H01L 29/165; H01L 21/02532; H01L 29/7848; H01L 21/823487
See application file for complete search history.

(56) References Cited

U.S. PATENT DOCUMENTS 5,714,777 A 2/1998 Ismail et al.
6,660,590 B2 12/2003 Yoo
(Continued)

OTHER PUBLICATIONS

Bhuwalka et al., "Scaling the Vertical Tunnel FET with Tunnel Bandgap Modulation and Gate Workfunction Engineering," IEEE Transactions on Electron Devices. vol. 52. No. 5. Apr. 25, 2005. pp. 909-917.

*Primary Examiner* — Ngan Ngo
(74) *Attorney, Agent, or Firm* — Tutunjian & Bitetto, P.C.; Vazken Alexanian

(57) ABSTRACT

A method of forming a vertical transport fin field effect transistor, including, forming a bottom source/drain layer at the surface of the substrate, forming one or more channels on the bottom source/drain layer, where the channels extend away from the bottom source/drain layer, forming a gate structure on each of the one or more channels, and forming a top source/drain segment on the top surface of each of the one or more channels, wherein either each of the top source/drain segments or the bottom source/drain layer has a larger bandgap than the other of the bottom source/drain layer or each of the top source/drain segments.

18 Claims, 6 Drawing Sheets

(51) Int. Cl.
*H01L 29/10* (2006.01)
*H01L 29/165* (2006.01)
*H01L 21/02* (2006.01)
*H01L 29/167* (2006.01)
*H01L 27/088* (2006.01)

(52) U.S. Cl.
CPC ...... *H01L 29/167* (2013.01); *H01L 29/66666* (2013.01); *H01L 29/7848* (2013.01)

(56) References Cited

U.S. PATENT DOCUMENTS

| | | |
|---|---|---|
| 6,846,709 B1 | 1/2005 | Lojek |
| 7,033,877 B2 | 4/2006 | Chaudhry et al. |
| 7,679,121 B2 | 3/2010 | Ouyang et al. |
| 7,768,036 B2 | 8/2010 | Ramaswamy et al. |
| 9,054,033 B2 | 6/2015 | Park |
| 9,136,363 B2 | 9/2015 | Park et al. |
| 9,245,885 B1 | 1/2016 | Xie et al. |
| 9,269,713 B2 | 2/2016 | Irsigler et al. |
| 2004/0157353 A1* | 8/2004 | Ouyang ............. H01L 29/1054 438/38 |
| 2012/0241722 A1 | 9/2012 | Ikeda et al. |
| 2016/0211368 A1* | 7/2016 | Chen ................... H01L 29/7827 |
| 2016/0240626 A1* | 8/2016 | Chang ............... H01L 29/42392 |
| 2017/0141214 A1* | 5/2017 | Zang ................. H01L 29/66795 |
| 2017/0194155 A1* | 7/2017 | Anderson ......... H01L 21/28518 |

\* cited by examiner

VERTICAL TRANSISTOR WITH REDUCED GATE-INDUCED-DRAIN-LEAKAGE CURRENT

BACKGROUND

Technical Field

The present invention generally relates to forming a vertical transport fin field effect transistor (VT FinFET) having reduced leakage current due to gate-induced-drain leakage (GIDL) and increased carrier injection, and more specifically to implementing a higher band gap on the drain side of a VT FinFET and a high germanium concentration silicon-germanium source on the opposite side of the vertical fin from the high bandgap drain.

Description of the Related Art

A Field Effect Transistor (FET) typically has a source, a channel, and a drain, where current flows from the source to the drain, and a gate that controls the flow of current through the channel. Field Effect Transistors (FETs) can have a variety of different structures, for example, FETs have been fabricated with the source, channel, and drain formed in the substrate material itself, where the current flows horizontally (i.e., in the plane of the substrate), and FinFETs have been formed with the channel extending outward from the substrate, but where the current also flows horizontally from a source to a drain. The channel for the FinFET can be an upright slab of thin approximately rectangular Si, commonly referred to as the fin with a gate on the fin, as compared to a metal-oxide-semiconductor field effect transistor (MOSFET) with a gate parallel with the plane of the substrate.

Depending on the doping of the source and drain, an n-type FET (NFET) or a p-type FET (PFET) can be formed. An NFET and a PFET can be coupled to form a complementary metal oxide semiconductor (CMOS) device, where a p-channel MOSFET and n-channel MOSFET are coupled together.

A current can flow even when the gate is in an electrical state that places a FET in an "off" state due to several leakage mechanisms. Carriers can move across a p-n junction around the drain region causing a leakage current. Gate-induced-drain leakage (GIDL) can occur at the drain side of a FET due to the electrical potential generated by the gate. GIDL can be caused by multiple mechanisms, including but not limited to, band-to-band tunneling (BTBT) and trap assisted tunneling.

With ever decreasing device dimensions, forming the individual components and electrical contacts become more difficult. An approach is therefore needed that retains the positive aspects of traditional FET structures, while overcoming the scaling issues created by forming smaller device components, including channel lengths and gate dielectric thicknesses.

SUMMARY

In accordance with an embodiment of the present invention, a method of forming a vertical transport fin field effect transistor, including, forming a bottom source/drain layer at the surface of the substrate, forming one or more channels on the bottom source/drain layer, where the channels extend away from the bottom source/drain layer, forming a gate structure on each of the one or more channels, and forming a top source/drain segment on the top surface of each of the one or more channels, wherein either each of the top source/drain segments or the bottom source/drain layer has a larger bandgap than the other of the bottom source/drain layer or each of the top source/drain segments.

In accordance with another embodiment of the present invention, a method of forming a vertical transport fin field effect transistor, including, forming a bottom source/drain layer at the surface of the substrate, wherein the bottom source/drain layer is doped with boron, gallium, or indium, forming one or more channels on the bottom source/drain layer, where the channels extend away from the bottom source/drain layer, forming a gate structure on each of the one or more channels, and forming a top source/drain segment on the top surface of each of the one or more channels, where each of the top source/drain segments is silicon-germanium having a germanium concentration in the range of about 40 at. % Ge to about 80 at. % Ge is provided.

In accordance with yet another embodiment of the present invention, a vertical transport fin field effect transistor, including, a bottom source/drain layer at the surface of the substrate, one or more channels on the bottom source/drain layer, where the channels extend away from the bottom source/drain layer, a gate structure on each of the one or more channels, and a top source/drain segment on the top surface of each of the one or more channels, wherein either each of the top source/drain segments or the bottom source/drain layer has a bandgap in the range of about 1.0 eV to about 1.2 eV, and the other of the bottom source/drain layer or each of the top source/drain segments has a bandgap in the range of about 0.7 eV to about 0.9 eV is provided.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
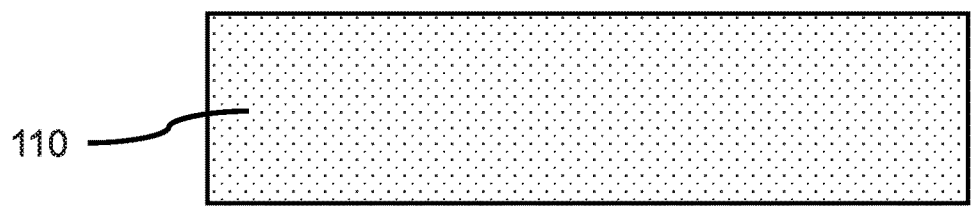
FIG. 1 is a cross-sectional side view showing a substrate, in accordance with an embodiment of the present invention.

Embodiments of the present invention relate generally to forming vertical transport fin field effect transistors (VT FinFETs) with a high bandgap material for the drain and a lower bandgap material for the sources, where the drain can be formed on the top or bottom of a vertical fin forming a channel, and the source can be on the opposite side of the vertical fin from the drain. In various embodiments, the sources can be at the top of the fin and the drains can be at the bottom of the fin, where the sources are composed of materials that increase carrier injection, and the bottom source/drains have a composition that reduces gate-induced-drain-leakage (GIDL). In other embodiments, the sources can be at the bottom of the fin and the drains can be at the top of the fin. The source and drain materials can also be selected to provide lower series resistance.

It has been realized that a strong parameter that affects GIDL current is the material properties on the drain side. Those material properties can be the bandgap, and the interface property between gate dielectric and the drain side material. Having silicon (Si) instead of silicon-germanium (SiGe) on the drain side has two advantages: (1) Si has a larger bandgap than SiGe, so band-to-band tunneling is reduced; and (2) the Si/high-k gate dielectric interface has a better quality than SiGe/high-k interface. A better interface quality means fewer interface traps, and a lower interface trap density results in lower trap-induced leakage current.

Embodiments of the present invention also relate generally to controlling the GIDL at the drain side of the VT FinFET by using epitaxial silicon (Si) having a larger band gap to reduce the amount of leakage current, for example, unstrained silicon typically has a bandgap around 1.12 eV at room temperature (i.e., 273 K). In contrast, SiGe with 50% Ge can have a bandgap ranging from about 0.8 eV to 0.9 eV at room temperature (i.e., 273 K), depending on the strain level in the SiGe. GIDL current is an exponential function of bandgap.

Embodiments of the present invention also relate generally to forming VT FinFETs with lower leakage current and resulting lower power consumption due to GIDL, while still utilizing a silicon-germanium (SiGe) source with a high germanium concentration (i.e., 40 at. % Ge or greater) to maintain high hole mobility for p-type VT FinFETs. The electrical field across the gate and drain can create a current flow (GIDL) between the drain and substrate. GIDL, therefore, occurs at the drain side of a VT FinFET.

Embodiments of the present invention also relate generally to controlling the carrier injection from the source side for the VT FinFET by using epitaxial, high Ge concentration silicon-germanium (SiGe) on the source-side of a channel to maintain higher VT FinFET performance characteristics, including but not limited to, drive current, carrier mobility, and carrier injection velocity.

Exemplary applications/uses to which the present invention can be applied include, but are not limited to: fabrication of Complementary metal-oxide-semiconductor (CMOS) devices for logic circuits (e.g., NAND, NOR, XOR, etc.), high speed memory (e.g., SRAM), application specific integrated circuits (ASICs), and system-on-chip (SOC).

In various embodiments, the materials and layers can be deposited by physical vapor deposition (PVD), chemical vapor deposition (CVD), atomic layer deposition (ALD), molecular beam epitaxy (MBE), or any of the various modifications thereof, for example, plasma-enhanced chemical vapor deposition (PECVD), metal-organic chemical vapor deposition (MOCVD), low pressure chemical vapor deposition (LPCVD), flowable chemical vapor deposition (FCVD), electron-beam physical vapor deposition (EB-PVD), and plasma-enhanced atomic layer deposition (PEALD). The depositions can be epitaxial processes, and the deposited material can be crystalline. In various embodiments, formation of a layer can be by one or more deposition processes, where, for example, a conformal layer may be formed by a first process (e.g., ALD, PEALD, etc.) and a fill may be formed by a second process (e.g., CVD, electrodeposition, PVD, etc.).

It is to be understood that the present invention will be described in terms of a given illustrative architecture; however, other architectures, structures, substrate materials and process features and steps can be varied within the scope of the present invention.

It should be noted that certain features may not be shown in all figures for the sake of clarity. This is not intended to be interpreted as a limitation of any particular embodiment, or illustration, or scope of the claims.

Reference to source/drain projections, layers, regions, etc., is intended to indicate that the particular device feature can be implemented as a source or a drain except as expressly indicated otherwise. As further described herein, the source and drain also can be different due to fabrication with different materials providing different electrical properties. In addition, the role of source and drain for an active device can in some instances be reversed, so a previously indicated drain may instead be a source and vice versa. Reference to a source/drain is, therefore, intended to encompass the broadest reasonable scope of the term.

Referring now to the drawings in which like numerals represent the same or similar elements and initially to FIG. 1, a cross-sectional side view of a substrate is shown, in accordance with an embodiment of the present invention.

In one or more embodiments, a substrate 110 can be a semiconductor or an insulator with an active surface semiconductor layer. The substrate can include a carrier layer that provides mechanical support for other layers of the substrate. The substrate can include crystalline, semi-crystalline, microcrystalline, or amorphous regions. The substrate can be essentially (i.e., except for contaminants) a single element (e.g., silicon), primarily (i.e., with doping) of a single element, for example, silicon (Si) or germanium (Ge), and/or the substrate can include a compound, for example, $Al_2O_3$, $SiO_2$, GaAs, SiC, Si:C, or SiGe. The substrate can also have multiple material layers, for example, a semiconductor-on-insulator substrate (SeOI), such as a silicon-on-insulator substrate (SOI), germanium-on-insulator substrate (GeOI), or silicon-germanium-on-insulator substrate (SGOI). The substrate can also have other layers forming the substrate, including high-k oxides and/or nitrides. Other semiconductor devices and features, such as shallow trench isolation (STI) regions, may already be formed on the substrate.

In one or more embodiments, the substrate 110 can be a silicon wafer. In various embodiments, the substrate can be a single crystal silicon (Si), silicon germanium (SiGe), or III-V semiconductor (e.g., GaAs) wafer, or have a single crystal silicon (Si), silicon germanium (SiGe), or III-V semiconductor (e.g., GaAs) surface/active layer.

Figure 2:
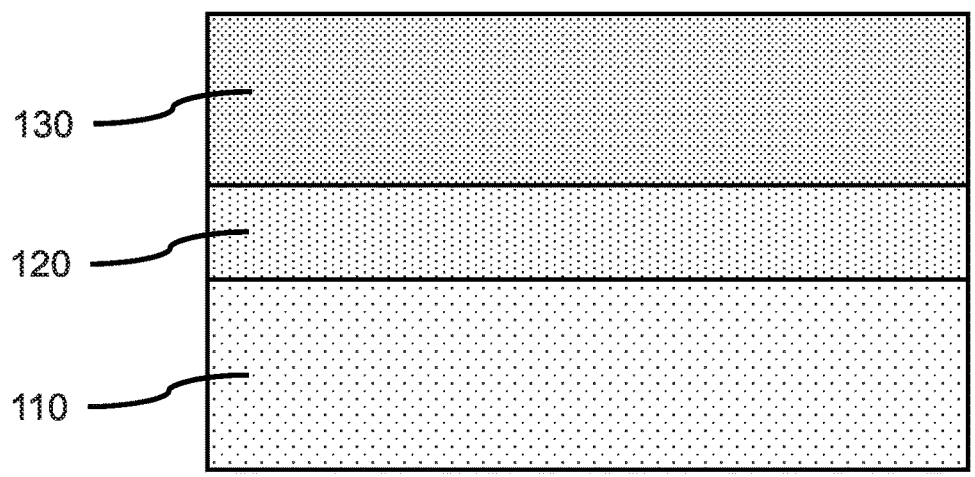
FIG. 2 is a cross-sectional side view showing a bottom source/drain layer at the surface of the substrate and a channel layer on the bottom source/drain layer, in accordance with an embodiment of the present invention.

FIG. 2 is a cross-sectional side view showing a bottom source/drain layer at the surface of the substrate and a channel layer on the bottom source/drain layer, in accordance with an embodiment of the present invention.

While the figures may suggest a drain being formed at the bottom of the fin, this is for illustrative purposes only. The drain can be at the top or bottom of the vertical fin(s), where the drain is formed from a material having a larger bandgap (e.g., Si), whereas the source is formed at the opposite side of the channel from a material having a smaller bandgap (e.g., SiGe).

In one or more embodiments, a bottom source/drain layer 120 can be formed at the surface of the substrate, where the bottom source/drain layer 120 can be formed in or on the substrate. The bottom source/drain layer 120 can be a doped layer that includes dopant species suitable to form a p-type bottom source/drain layer 120 (e.g., boron, gallium, and indium), or dopant species suitable to form an n-type bottom source/drain layer 120 (e.g., phosphorus, arsenic, and antimony).

In one or more embodiments, a bottom source/drain layer 120 can be formed by epitaxially growing a bottom source/drain layer 120 on the surface of the substrate 110, where the substrate surface can have a predetermined crystal face (e.g., (100)).

In various embodiments, the bottom source/drain layer 120 can be grown by vapor phase epitaxy (VPE), ion beam epitaxy (IBE), ultrahigh vacuum chemical vapor deposition (UHVCVD), rapid thermal chemical vapor deposition (RTCVD), metalorganic chemical vapor deposition (MOCVD), low-pressure chemical vapor deposition (LPCVD), limited reaction processing chemical vapor deposition (LRPCVD), molecular beam epitaxy (MBE), liquid-phase epitaxy (LPE), or other suitable process, and combinations thereof. The bottom source/drain layer 120 can be doped in situ (i.e., during epitaxial growth), or ex situ (i.e., after growing the layer expitaxially). The bottom source/drain layer 120 can be grown to a predetermined thickness.

In one or more embodiments, the bottom source/drain layer 120 can be formed by dopant implantation into the surface of the substrate 110. The predetermined dopant can be implanted to a predetermined depth to form a bottom source/drain layer 120 with a predetermined thickness. In various embodiments, the bottom source/drain layer 120 can be formed by any suitable doping techniques, including but not limited to, ion implantation, gas phase doping, plasma doping, plasma immersion ion implantation, cluster doping, infusion doping, liquid phase doping, solid phase doping, etc.

In one or more embodiments, the bottom source/drain layer 120 can have a dopant concentration in the range of about $2\times10^{17}$ to about $5\times10^{21}$, or in the range of about $1\times10^{19}$ to about $1\times10^{21}$ atoms/cm$^3$, where the bottom source/drain layer 120 forms a bottom drain.

In one or more embodiments, the bottom source/drain layer 120 can have a dopant concentration in the range of about $5\times10^{18}$ to about $3\times10^{21}$, or in the range of about $5\times10^{19}$ to about $1\times10^{21}$, where the bottom source/drain layer 120 forms a bottom source.

The active dopant concentration can be as high as possible to reduce resistance.

In one or more embodiments, the bottom source/drain layer 120 can be silicon (Si), where the bottom source/drain layer 120 forms a bottom drain.

In one or more embodiments, a bottom source/drain layer 120 configured to form a bottom drain can have a bandgap in the range of about 1.0 eV to about 1.2 eV, or in the range of about 1.1 eV to about 1.3 eV, or about 1.12 eV, where the bandgap reduces GIDL.

In one or more embodiments, the bottom source/drain layer 120 can be silicon-germanium (SiGe), where the bottom source/drain layer 120 forms a bottom source. The bottom source/drain layer 120 can have a germanium concentration in the range of about 40 at. % Ge to about 100 at. % Ge, or in the range of about 40 at. % Ge to about 80 at. % Ge, or in the range of about 50 at. % Ge to about 80 at. % Ge, or in the range of about 60 at. % Ge to about 70 at. % Ge, or about 65 at. % Ge (at. %=atomic percent). A higher Ge % can provide a smaller bandgap of SiGe and a higher hole injection velocity for a bottom source/drain layer 120 configured as a source.

In one or more embodiments, a bottom source/drain layer 120 configured to form a bottom source can have a bandgap in the range of about 0.7 eV to about 0.9 eV, or in the range of about 0.75 eV to about 0.85 eV, where the bandgap increases carrier injection.

In one or more embodiments, the bottom source/drain layer 120 can be formed to a thickness in the range of about 10 nm to about 100 nm, or in the range of about 30 nm to about 50 nm, although other thicknesses are also contemplated.

A high-k gate dielectric can enhance the electrical field near a drain due to fringe effects. Higher electric field can result in higher GIDL. GIDL current is also an exponential function of bandgap. In a VT FinFET, having the drain at the bottom, the high-k gate dielectric 160 can be between the gate and the bottom source/drain along the horizontal surfaces. In contrast, for a conventional horizontal FET, the high-k dielectric may only be on top of the channel, and not part of a spacer.

In various embodiments, the bottom source/drain layer 120 can be heat treated to activate the dopant species, setting the bottom junction, and/or recrystallizing the bottom source/drain layer 120 in the event that part or the entire bottom source/drain layer is damaged/amorphized due to implantation.

In a non-limiting exemplary embodiment, for a pFET with a bottom drain, the bottom source/drain layer 120 can be single crystal silicon doped with boron on a single crystal silicon substrate 110. For an nFET with a bottom drain, single crystal silicon doped with phosphorus, arsenic, and/or antimony can be used for the bottom source/drain layer 120.

In a non-limiting exemplary embodiment, for a pFET with a bottom source, the bottom source/drain layer 120 can be single crystal silicon-germanium doped with boron on a single crystal silicon substrate 110, where the silicon-germanium has a germanium concentration of about 65 at. %. For an nFET with a bottom source, single crystal silicon-germanium doped with phosphorus, arsenic, and/or antimony can be used for the bottom source/drain layer 120.

In various embodiments, the bottom source/drain layer 120 may further include carbon with a range of about 0.1 to about 2.5% (atomic % concentration).

In one or more embodiments, a channel layer 130 can be formed on the bottom source/drain layer 120. The channel layer can be formed by epitaxial growth on the bottom source/drain layer 120, where the channel layer 130 can be grown by vapor phase epitaxy (VPE), ion beam epitaxy (IBE), ultrahigh vacuum chemical vapor deposition (UHVCVD), rapid thermal chemical vapor deposition (RTCVD), metalorganic chemical vapor deposition (MOCVD), low-pressure chemical vapor deposition (LP-CVD), limited reaction processing chemical vapor deposition (LRPCVD), molecular beam epitaxy (MBE), liquid-phase epitaxy (LPE), or other suitable process, and combinations thereof.

In one or more embodiments, the channel layer 130 can be single crystal silicon (Si) or single crystal silicon-germanium (SiGe) with the same crystal orientation as the bottom source/drain layer 120 on which the channel layer 130 is grown. In various embodiments, the channel layer 130 can be a semiconductor material, which can be an intrinsic semiconductor material.

In various embodiments, the channel layer 130 can be silicon-germanium ($Si_xGe_{1-x}$), where the channel layer material can have a germanium concentration in the range of about 10 at. % Ge to about 40 at. % Ge, or in the range of about 20 at. % Ge to about 30 at. % Ge, or about 20 at. % Ge (at. %=atomic percent). In various embodiments, the channel layer 130 can have a germanium concentration that is ±20 at. % of the germanium concentration of the top source/drain segments 200, or ±20 at. % of the germanium concentration of the bottom source/drain layer 120. In various embodiments, the channel layer 130 can have a germanium concentration that is <20 at. % Ge at the interface with a silicon bottom source/drain layer 120 or top source/drain segment 200, such that the lattice mismatch is reduced at the silicon/silicon-germanium interface.

In one or more embodiments, the channel layer 130 can be undoped or doped, where the dopant concentration can be lower than $1\times10^{17}/cm^3$ to reduce random dopant fluctuation. The channel layer 130 can be undoped to allow formation of a fully depleted channel. In other embodiments, the channel layer 130 can be doped with a doping concentration ranging from $1\times10^{17}$ to $1\times10^{19}/cm^3$ to adjust the threshold voltage of the device. The channel layer can be unstrained or strained. Typical strain level can range from −1.5% (compressive strain) to +1.5% (tensile strain).

In one or more embodiments, the channel layer 130 can be formed to a thickness in the range of about 30 nm to about 150 nm, or in the range of about 50 nm to about 100 nm, or in the range of about 20 nm to about 30 nm, although other thicknesses are also contemplated. The thickness of the channel layer 130 can determine the effective length of a channel in a vertical transport fin field effect transistor.

Figure 3:
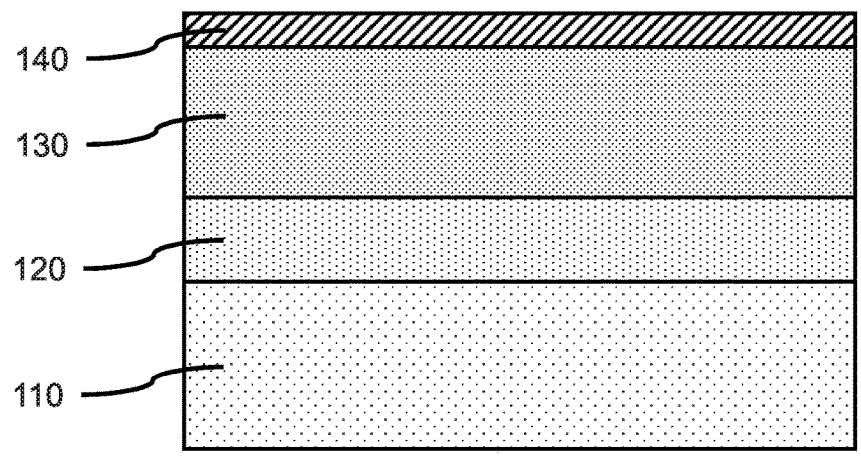
FIG. 3 is a cross-sectional side view showing a bottom source/drain layer at the surface of the substrate, a channel layer on the bottom source/drain layer, and a fin template layer on the channel layer, in accordance with an embodiment of the present invention.

FIG. 3 is a cross-sectional side view showing a bottom source/drain layer at the surface of the substrate, a channel layer on the bottom source/drain layer, and a fin template layer on the channel layer, in accordance with an embodiment of the present invention.

In one or more embodiments, a fin template layer 140 can be formed on the channel layer 130, where the fin template layer 140 can be a hardmask. The fin template layer 140 can be blanket deposited, for example, by CVD or PECVD on the exposed surface of the channel layer 130.

In various embodiments, the fin template layer 140 can be silicon oxide (SiO), silicon nitride (SiN), silicon oxynitride (SiON), silicon carbonitride (SiCN), silicon boronitride (SiBN), silicon carbide (SiC), silicon borocarbide (SiBC), silicon boro carbonitride (SiBCN), boron carbide (BC), boron nitride (BN), or combinations thereof, where the fin template layer 140 may include one or more layers.

Figure 4:
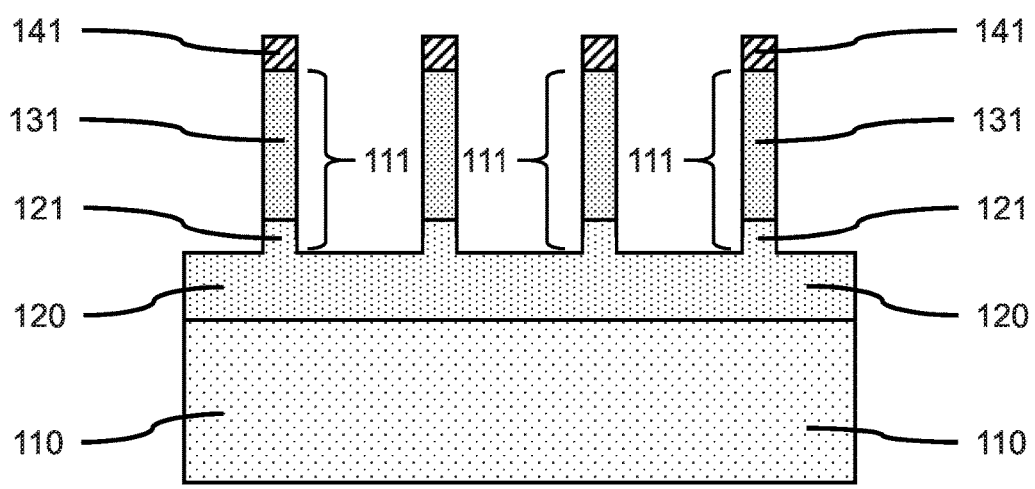
FIG. 4 is a cross-sectional side view showing a plurality of vertical fins formed from the channel layer and a portion of the bottom source/drain layer on the substrate, in accordance with an embodiment of the present invention.

FIG. 4 is a cross-sectional side view showing a plurality of vertical fins formed from the channel layer and a portion of the bottom source/drain layer on the substrate, in accordance with an embodiment of the present invention.

In various embodiments, a plurality of vertical fins 111 can be formed by a sidewall image transfer (SIT) process, self-aligned double patterning (SADP) process, or self-aligned quadruple patterning (SAQP) process, to provide a tight pitch between vertical fins 111. In various embodiments, a direct print can be used to provide the fin templates 141 from the fin template layer 140. Immersion Lithography can direct print down to about 78 nm pitch. Extreme ultraviolet lithography (also known as EUV or EUVL), considered a next-generation lithography technology using an extreme ultraviolet (EUV) wavelength, can direct print down to a pitch smaller than 50 nm. Self-aligned double patterning (SADP) can achieve down to about 40 nm to 60 nm fin pitch. Self-aligned quadruple patterning (SAQP) may be used to go down to below 40 nm fin pitch. While the figures illustrate a sidewall image transfer (SIT) process, this is for descriptive purposes, since these other processes are also contemplated, and the scope of the claims and invention should not be limited to the particular illustrated features.

The fin template layer 140 can be patterned by such processes to form one or more fin templates 141.

In one or more embodiments, a masking layer can be formed and patterned on the fin template layer 140. The masking layer can be a softmask layer, for example, an organic lithography layer, or an extreme ultra violet lithography (EUVL) material that can be patterned and developed to expose a portion of the underlying hardmask layer 140. In one or more embodiments, the masking layer can be a positive or negative resist material, for example, Poly(m-ethyl methacrylate) (PMMA) or SU-8, or an electron-beam (e-beam) cured material, for example, hydrogen silsesquioxane (HSQ) that can be suitably patterned.

In one or more embodiments, the fin templates 141 can be used to mask portions of the underlying channel layer 130. In various embodiments, portions of the channel layer 130 exposed between fin templates 141 can be removed, for example, by a directional selective etch, such as a reactive ion etch (RIE), to form one or more channels 131 from the channel layer 130, where the channels extend vertically away from the bottom source/drain layer 120. A fin template 141 can be on each channel 131 formed from the channel layer 130.

In one or more embodiments, a portion of the bottom source/drain layer 120 can be removed from around a channel 131 to form an extension region 121 below each channel 131. A portion of the bottom source/drain layer 120 exposed between the channels 131 can be removed, for example, by an RIE, to form extension regions 121 below each channel 131. The channel 131 and extension region 121 can form a vertical fin 111 having a predetermined effective gate length, $L_{eff}$, where a fin template 141 covers the top of each vertical fin 111.

In one or more embodiments, the bottom source/drain layer 120 can be removed to a depth in the range of about 1 nm to about 20 nm or in the range of about 5 nm to about 10 nm, where the removal of the portion of the bottom source/drain layer 120 forms an extension region with a height from the surface of the bottom source/drain layer 120 in the range of about 1 nm to about 20 nm or in the range of about 5 nm to about 10 nm. The remaining portion of the bottom source/drain layer 120 can have a thickness in the range of about 10 nm to about 70 nm, or in the range of about 20 nm to about 40 nm.

Figure 5:
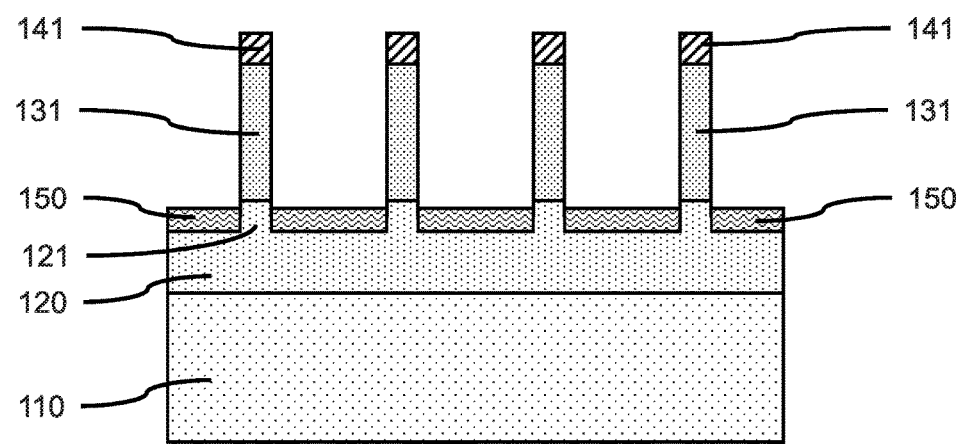
FIG. 5 is a cross-sectional side view showing a bottom spacer formed on the bottom source/drain layer and extension regions of the vertical fins, in accordance with an embodiment of the present invention.

FIG. 5 is a cross-sectional side view showing a bottom spacer formed on the bottom source/drain layer and extension regions of the vertical fins, in accordance with an embodiment of the present invention.

In one or more embodiments, a bottom spacer 150 can be formed on at least a portion of the exposed bottom source/drain layer 120 and extension regions 121, where the bottom spacer 150 can be formed by a blanket deposition or by a directional deposition, for example, by high density plasma (HDP) depositions, gas cluster ion beam (GCIB), or combinations thereof, and etched back (e.g., by a selective and isotropic wet or dry etch).

In one or more embodiments, the bottom spacer 150 can have a thickness in the range of about 2 nm to about 10 nm or in the range of about 4 nm to about 6 nm. In various embodiments, a portion of the extension regions 121 can be exposed above the top surface of the bottom spacer 150.

In one or more embodiments, the bottom spacer layer 150 can be a silicon oxide (SiO), a silicon nitride (SiN), a silicon oxynitride (SiON), a silicon carbonitride (SiCN), a silicon boronitride (SiBN), a silicon borocarbide (SiBC), a silicon boro carbonitride (SiBCN), a boron carbide (BC), a boron nitride (BN), a low-K dielectric material, or a combination thereof. A low-k dielectric material can include, but not be limited to, a fluoride-doped silicon oxide (e.g., fluoride doped glass), a carbon doped silicon oxide, a porous silicon oxide, a spin-on silicon based polymeric material (e.g., tetraethyl orthosilicate (TEOS), hydrogen silsesquioxane (HSQ) and methylsilsesquioxane (MSQ)), or combinations thereof.

Figure 6:
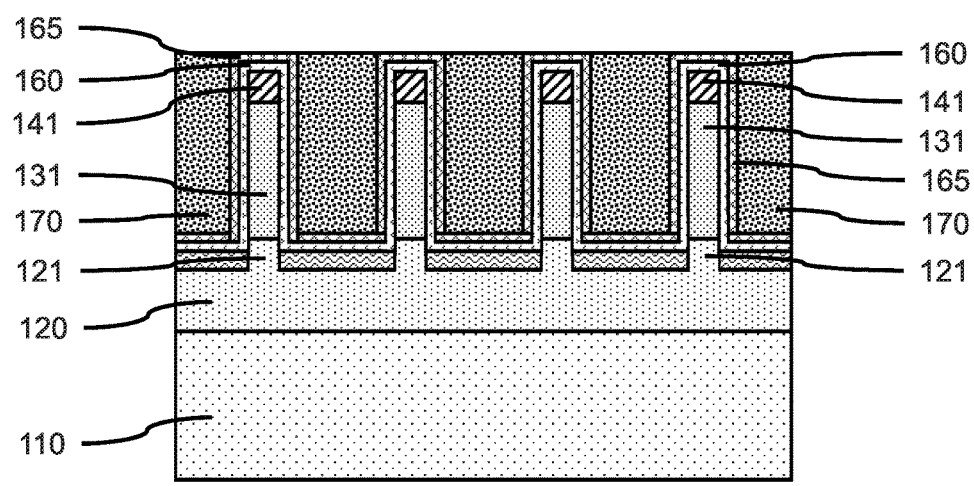
FIG. 6 is a cross-sectional side view showing a gate dielectric layer on the vertical fins, and a gate electrode formed on the gate dielectric layer, in accordance with an embodiment of the present invention.

FIG. 6 is a cross-sectional side view showing a gate dielectric layer on the vertical fins, and a gate electrode formed on the gate dielectric layer, in accordance with an embodiment of the present invention.

In one or more embodiments, a gate dielectric layer 160 can be formed on the exposed surfaces of the bottom spacer layer 150, channels 131, and fin templates 141, where the gate dielectric layer 230 can be conformally deposited (e.g., by ALD, PEALD, CVD).

In one or more embodiments, the gate dielectric layer 160 can be an insulating dielectric layer, for example, a silicon oxide (SiO), silicon nitride (SiN), silicon oxynitride (SiON), a high-K dielectric, or a suitable combination of these materials.

In various embodiments, the gate dielectric layer 160 can be a high-K dielectric material that can include, but is not limited to, transition metal oxides such as hafnium oxide (e.g., HfO$_2$), hafnium silicon oxide (e.g., HfSiO$_4$), hafnium silicon oxynitride (Hf$_w$Si$_x$O$_y$N$_z$), lanthanum oxide (e.g., La$_2$O$_3$), lanthanum aluminum oxide (e.g., LaAlO$_3$), zirconium oxide (e.g., ZrO$_2$), zirconium silicon oxide(e.g., ZrSiO$_4$), zirconium silicon oxynitride (Zr$_w$Si$_x$O$_y$N$_z$), tantalum oxide (e.g., TaO$_2$, Ta$_2$O$_5$), titanium oxide (e.g., TiO$_2$), barium strontium titanium oxide (e.g., BaTiO$_3$—SrTiO$_3$), barium titanium oxide(e.g., BaTiO$_3$), strontium titanium oxide(e.g., SrTiO$_3$), yttrium oxide (e.g., Y$_2$O$_3$), aluminum oxide (e.g., Al$_2$O$_3$), lead scandium tantalum oxide (Pb (Sc$_x$Ta$_{1-x}$)O$_3$), and lead zinc niobate (e.g., PbZn$_{1/3}$ Nb$_{2/3}$ O$_3$). The high-k material can further include dopants such as lanthanum and/or aluminum. The stoichiometry of the high-K compounds can vary.

In one or more embodiments, the gate dielectric layer 160 can have a thickness in the range of about 1 nm to about 4 nm, or can have a thickness in the range of about 1 nm to about 2 nm.

In one or more embodiments, a work function layer 165 can be formed on the exposed surfaces of the gate dielectric layer 160, where the work function layer 165 can be conformally deposited by ALD, PEALD, CVD, PECVD, or combinations thereof.

In one or more embodiments, a work function layer 165 can be formed on the gate dielectric layer 160, where the work function layer and gate dielectric layer 160 can surround at least a portion of each of one or more vertical fin(s) 111 as a part of a gate structure. The work function layer 165 can be formed on the gate dielectric layer 160 to adjust the electrical properties of a gate electrode. In various embodiments, the work function layer 165 can be optional. A portion of the work function layer 165 can be formed on the gate dielectric layer 160 on the sidewalls of the vertical fins 111, fin templates 141, and bottom spacer layer 150. In various embodiments, different work function layers 165 can be formed for the nFETs and pFETs, respectively.

In various embodiments, a work function layer 165 can be a conductive nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a conductive carbide, including but not limited to titanium carbide (TiC), titanium aluminum carbide (TiAlC), tantalum carbide (TaC), hafnium carbide (HfC); or combinations thereof. The work function layer 165 can include multiple layers of work function materials, for example, a work function layer can be a TiN/TiC stack.

In various embodiments, the work function layer 165 can have a thickness in the range of about 1 nm to about 11 nm, or can have a thickness in the range of about 3 nm to about 5 nm.

In one or more embodiments, a gate fill layer 170 can be formed on the gate dielectric layer 160 and/or work function layer 165 if present, where the gate fill layer 170 can fill in the space between vertical fins 111. The gate fill layer 170, gate dielectric layer 160, and optionally the work function layer, can form a gate structure on one or more vertical fin(s) 111, where the gate fill layer 170 and work function layer 165 can form a conductive gate electrode.

In various embodiments, the gate fill layer 170 can be doped polycrystalline or amorphous silicon, germanium, silicon-germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material may further comprise dopants that are incorporated during or after deposition.

In one or more embodiments, the gate fill layer 170 can be blanket deposited, and a chemical-mechanical polishing (CMP) used to remove gate fill layer material that extends above the top surfaces of the fin templates 141, gate dielectric layer 160 and/or work function layer 165 if present, where the CMP can provide a smooth, flat surface.

In one or more embodiments, the same material(s) can be used to serve as a work function layer 165 and the gate fill layer 170. After the formation of the gate electrode, remaining gaps between gate electrodes can be filled with an insulating dielectric material (e.g., silicon nitride, and/or silicon oxide).

Figure 7:
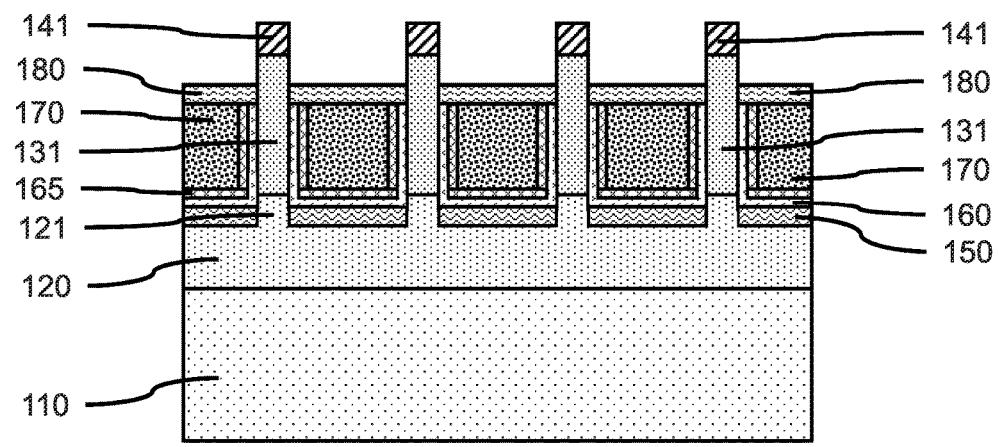
FIG. 7 is a cross-sectional side view showing a recessed gate structure, and a top spacer formed on the recessed gate structure, in accordance with an embodiment of the present invention.

FIG. 7 is a cross-sectional side view showing a recessed gate structure, and a top spacer formed on the recessed gate structure, in accordance with an embodiment of the present invention.

In one or more embodiments, a portion of the gate fill layer 170, gate dielectric layer 160 and work function layer 165 if present, can be removed to recess the gate structure. A portion of the gate fill layer 170 can be removed by a selective, directional etch (e.g., RIE), or other suitable patterning techniques, to expose a portion of the underlying work function layer 165. The exposed portion of the work function layer 165 can be removed by a selective, isotropic etch (e.g., wet chemical etch, dry plasma etch) to expose the underlying gate dielectric layer 160. A portion of the gate dielectric layer 170 can be removed by a selective, isotropic etch (e.g., wet chemical etch, dry plasma etch) to expose a portion of the underlying fin template 141 and channel 131.

In various embodiments, the gate fill layer 170, gate dielectric layer 160 and work function layer 165 if present, can be recessed sufficiently to expose an upper section of the channel 131, where about ½ to about ⅙ of the channel 131 can be exposed by recessing the gate structure.

In one or more embodiments a top spacer layer 180 can be formed on the exposed surfaces of the gate fill layer 170, gate dielectric layer 160 and work function layer 165 if present.

In one or more embodiments, the top spacer layer 180 can be a silicon oxide (SiO), a silicon nitride (SiN), a silicon oxynitride (SiON), a silicon carbonitride (SiCN), a silicon boronitride (SiBN), a silicon borocarbide (SiBC), a silicon boro carbonitride (SiBCN), a boron carbide (BC), a boron nitride (BN), a low-K dielectric material, or a combination thereof. A low-k dielectric material can include, but not be limited to, a fluoride-doped silicon oxide (e.g., fluoride doped glass), a carbon doped silicon oxide, a porous silicon oxide, a spin-on silicon based polymeric material (e.g., tetraethyl orthosilicate (TEOS), hydrogen silsesquioxane (HSQ) and methylsilsesquioxane (MSQ)), or combinations thereof. In various embodiments, the bottom spacer layer 150 can be formed by CVD, LPCVD, or spun on.

In one or more embodiments, the top spacer layer 180 can have a thickness in the range of about 3 nm to about 12 nm, or in the range of about 4 nm to about 7 nm, although other thicknesses are contemplated. The height of the channel exposed by recessing the gate structure can determine the thickness of the top spacer layer 180.

Figure 8:
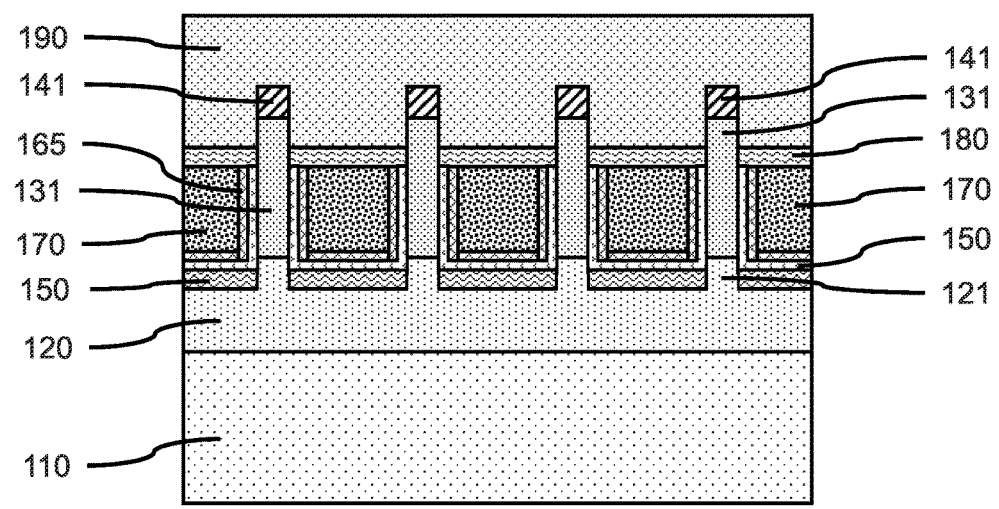
FIG. 8 is a cross-sectional side view showing an interlayer dielectric layer on the top spacer, fin templates, and exposed portions of the channels, in accordance with an embodiment of the present invention.

FIG. 8 is a cross-sectional side view showing an interlayer dielectric layer on the top spacer, fin templates, and exposed portions of the channels, in accordance with an embodiment of the present invention.

In one or more embodiments, an interlayer dielectric layer 190 can be formed on the top spacer layer 180, exposed portions of the channel 131 and the fin templates 141. The interlayer dielectric layer 190 can extend above the top surfaces of the fin templates 141.

In one or more embodiments, the interlayer dielectric (ILD) layer 190 can be formed by a blanket deposition, for example, CVD, PECVD, LPCVD, spun on, or a combination thereof.

In one or more embodiments, the ILD layer 190 can be silicon oxide (SiO), a low-k dielectric, a flowable polymeric material, or a combination thereof. A low-k dielectric material can include, but not be limited to, a fluoride-doped silicon oxide (e.g., fluoride doped glass), a carbon doped silicon oxide, a porous silicon oxide, a spin-on silicon based polymeric material (e.g., tetraethyl orthosilicate (TEOS), hydrogen silsesquioxane (HSQ) and methylsilsesquioxane (MSQ)), or combinations thereof.

Figure 9:
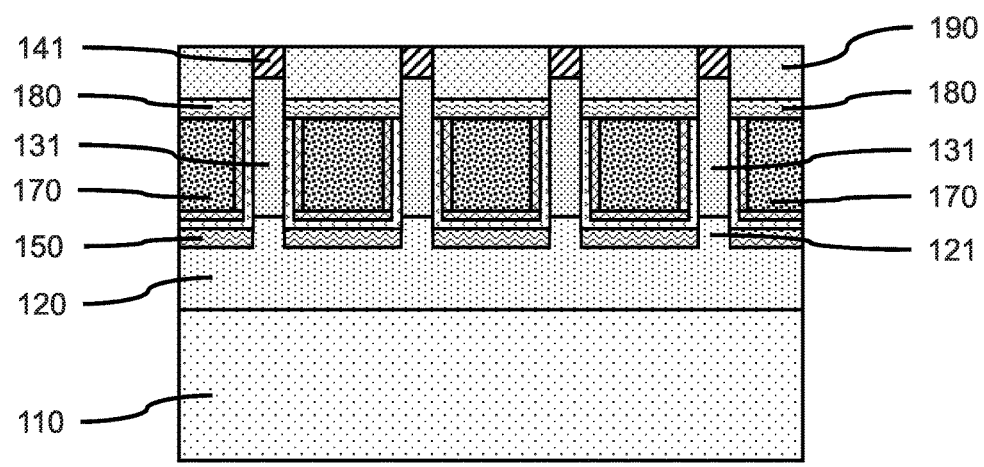
FIG. 9 is a cross-sectional side view showing a reduced height interlayer dielectric layer and exposed surfaces of the fin templates, in accordance with an embodiment of the present invention.

FIG. 9 is a cross-sectional side view showing a reduced height interlayer dielectric layer and exposed surfaces of the fin templates, in accordance with an embodiment of the present invention.

In one or more embodiments, the height of the ILD layer 190 can be reduced using CMP to expose the top surfaces of the fin templates 141. After being exposed, the fin templates 141 can be removed to expose the top surface of the underlying channel 131, where the top surface of the channels 131 can have a crystalline face.

Figure 10:
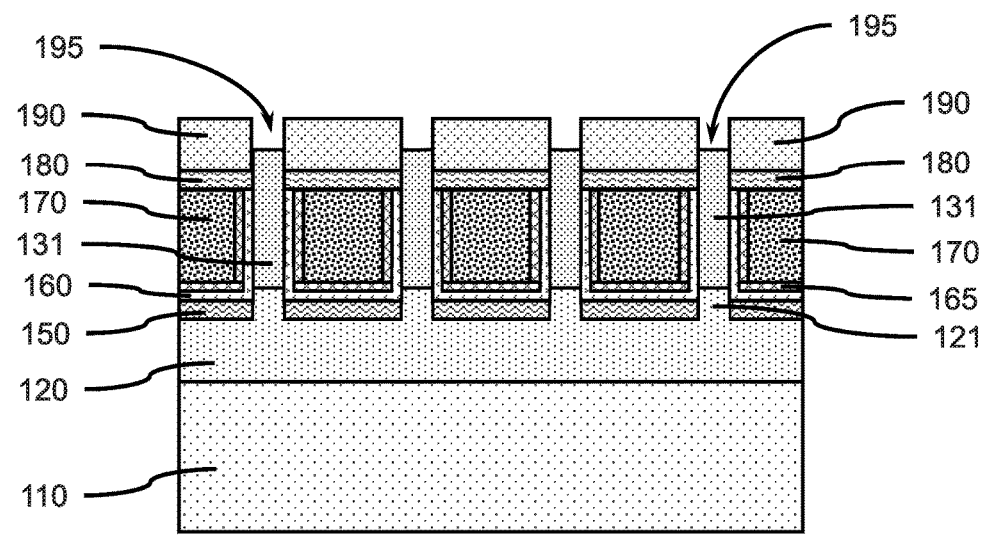
FIG. 10 is a cross-sectional side view showing exposed to surfaces of the channels after removal of the fin templates, in accordance with an embodiment of the present invention.

FIG. 10 is a cross-sectional side view showing exposed to surfaces of the channels after removal of the fin templates, in accordance with an embodiment of the present invention.

In one or more embodiments, the fin templates 141 can be removed to expose the underlying channels 131, where the fin templates can be removed by a selective etch (e.g. wet etch, RIE, etc.). Removal of the fin templates can form troughs 195 in the ILD layer 190 that expose the top surface of a channel 131.

Figure 11:
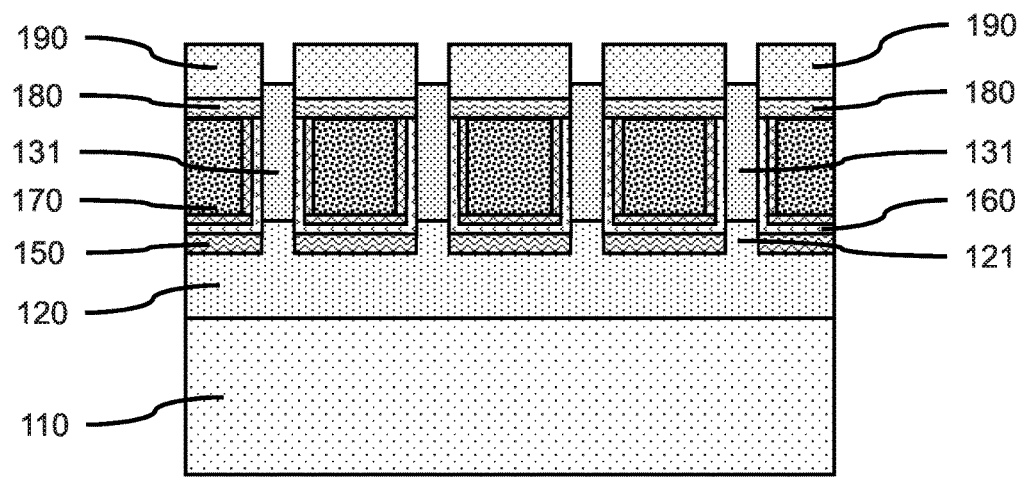
FIG. 11 is a cross-sectional side view showing channels with reduced heights, in accordance with an embodiment of the present invention.

FIG. 11 is a cross-sectional side view showing channels with reduced heights, in accordance with an embodiment of the present invention.

In various embodiments, an upper portion of the channels 131 can be removed to reduce the height of the channels 131, where the channels can be etched by wet etching or by a dry plasma etch, where the dry plasma can be a directional reactive ion etch (RIE). Removal of a portion of the channels 131 can decrease the effective gate length, and provide deeper troughs for forming source/drain segments.

Figure 12:
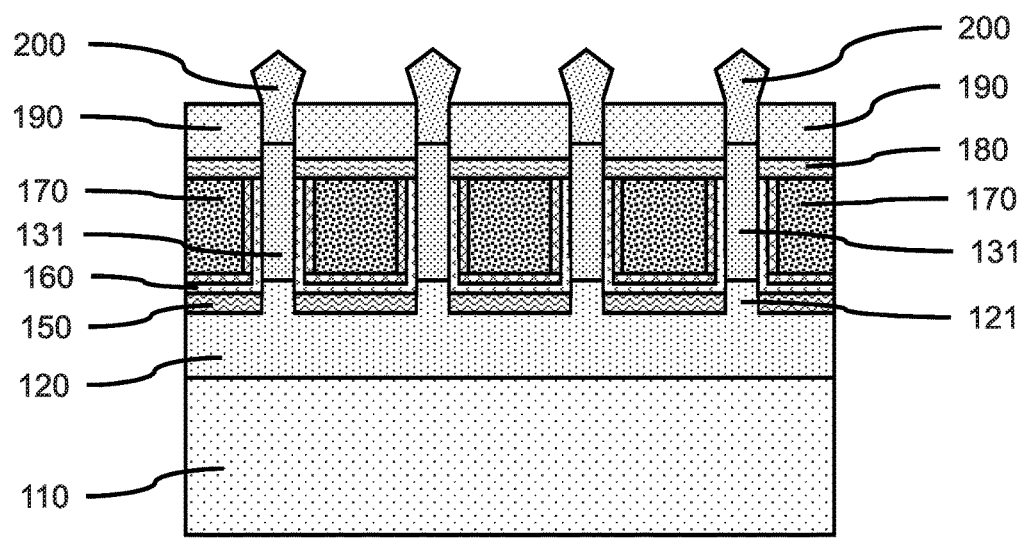
FIG. 12 is a cross-sectional side view showing top source/drain segments formed on the channels, in accordance with an embodiment of the present invention.

FIG. 12 is a cross-sectional side view showing top source/drain segments formed on the channels, in accordance with an embodiment of the present invention.

In one or more embodiments, a top source/drain segment 200 can be formed on the surface of each exposed channel 131, where the top source/drain segment 200 can be epitaxially grown on the exposed surface of the channel 131. The top source/drain segment 200 can be formed to a height greater than the depth of the trough 195, such that the top source/drain segment 200 extends above the surface of the ILD layer 190.

In one or more embodiments, the top source/drain segments 200 can have a height in the range of about 10 nm to about 100 nm, or in the range of about 20 nm to about 40 nm, although other heights are contemplated.

In one or more embodiments, the top source/drain segments 200 can be grown by vapor phase epitaxy (VPE), ion beam epitaxy (IBE), ultrahigh vacuum chemical vapor deposition (UHVCVD), rapid thermal chemical vapor deposition (RTCVD), metalorganic chemical vapor deposition (MOCVD), low-pressure chemical vapor deposition (LP-CVD), limited reaction processing chemical vapor deposition (LRPCVD), molecular beam epitaxy (MBE), liquid-phase epitaxy (LPE), or other suitable process, and combinations thereof.

In one or more embodiments, the top source/drain segments 200 can be silicon-germanium (SiGe) with a high germanium concentration (i.e., 40 at. % Ge or greater). In various embodiments, the top source/drain segments 200 can have a germanium concentration in the range of about 40 at. % Ge to about 100 at. % Ge, or in the range of about 40 at. % Ge to about 80 at. % Ge, or in the range of about 50 at. % Ge to about 80 at. % Ge, or in the range of about 60 at. % Ge to about 70 at. % Ge, or about 65 at. % Ge (at. %=atomic percent).

In one or more embodiments, the germanium concentration of a silicon-germanium top source/drain segment 200 can have an approximately constant germanium concentration (i.e., within epitaxial growth process constraints), a stepped germanium concentration gradient, or a linear germanium concentration gradient, where the specified germanium concentration is at the interface with the channel 131, and the germanium concentration changes moving away from the channel-top source/drain segment interface. In various embodiments, the specified germanium concentration of a top source/drain segment 200 extends at least 10 nm from the interface with the channel. In various embodiments, the thickness of each layer in a stepped concentration gradient top source/drain segment 200 can be at least 10 nm, or in the range of 10 nm to about 20 nm.

In one or more embodiments, a top source/drain segment 200 configured to form a top source can have a bandgap in the range of about 0.7 eV to about 0.9 eV, or in the range of about 0.75 eV to about 0.85 eV, where the bandgap increases carrier injection.

In one or more embodiments, the top source/drain segments 200 can be silicon-germanium (SiGe), where the top source/drain segments form a top source. A top source segment can have a lower bandgap than a bottom drain.

In one or more embodiments, a top source/drain segment 200 configured to form a top drain can have a bandgap in the range of about 1.0 eV to about 1.2 eV, or in the range of about 1.1 eV to about 1.13 eV, or about 1.12 eV, where the bandgap is selected to reduce GIDL.

In one or more embodiments, the top source/drain segments 200 can be silicon (Si), where the top source/drain segments form a top drain. The silicon can be single crystal silicon. A top drain segment can have a higher bandgap than a bottom source.

In one or more embodiments, the top source/drain segments 200 can be doped in situ (i.e., during epitaxial growth), or ex situ (i.e., after growing the layer expitaxially). In various embodiments, the top source/drain segments 200 can be formed by any suitable doping techniques, including but not limited to, ion implantation, gas phase doping, plasma doping, plasma immersion ion implantation, cluster doping, infusion doping, liquid phase doping, solid phase doping, etc. The top source/drain segments 200 can be doped with a dopant species suitable to form a p-type top source/drain segment 200 (e.g., boron, gallium, indium). In various embodiments, the top source/drain segments 200 can have a dopant concentration in the range of about $5 \times 10^{18}$ to about $3 \times 10^{21}$, or in the range of about $5 \times 10^{19}$ to about $1 \times 10^{21}$. A higher Ge % can provide a smaller bandgap of SiGe and a higher hole injection velocity.

In various embodiments, either each of the top source/drain segments 200 or the bottom source/drain layer 120 has a larger bandgap than the other of the bottom source/drain layer 120 or each of the top source/drain segments 200. A channel-bottom source/drain interface can have a larger bandgap or smaller bandgap than a channel-top source/drain segment interface.

In a non-limiting exemplary embodiments, either each of the top source/drain segments 200 or the bottom source/drain layer 120 has a bandgap in the range of about 1.0 eV to about 1.2 eV, and the other of the bottom source/drain layer 120 or each of the top source/drain segments 200 has a bandgap in the range of about 0.7 eV to about 0.9 eV.

In one or more embodiments, the arrangement of the bottom source/drain layer 120, channel 131, and top source/drain segment 200 forms a vertical transport fin field effect transistor, where current flows along a vertical path from a source to a drain. In various embodiments, the current can flow downward from the top source/drain segment 200 through the channel 131 and extension region 121 into the bottom source/drain layer 120 adjacent to the substrate 110. In various embodiments, the positioning of the source and drain can be reversed, such that the bottom source/drain layer 120 can be a bottom source layer and the top source/drain segment 200 can be a top drain, where the current can flow upwards. The source side can have a smaller bandgap and a higher carrier injection velocity (e.g., by having a high Ge % SiGe for the source side), and a larger bandgap and a smaller GIDL current (e.g., by having Si on drain side).

In one or more embodiments, the bottom source/drain layer 120 and top source/drain segment 200 can be suitably doped to form an n-type field effect transistor (nFET) (e.g., phosphorus, arsenic, antimony, or combinations thereof), or a p-type field effect transistor (pFET) (e.g., boron, gallium, indium, or combinations thereof).

In various embodiments, the interface trap density between a silicon top source/drain segment 200 and a silicon-germanium channel 131 with a 20 at. % Ge concentration can be approximately defect free (i.e., below detectable limits). In various embodiments, the interface trap density between a silicon top source/drain segment 200 or a silicon bottom source/drain layer 120 and a silicon-germanium channel 131 with a 20 at. % Ge concentration can be less than $1 \times 10^6$ defects/cm$^2$ at the interface. In various embodiments, the interface trap density between a silicon top source/drain segment 200 or a silicon bottom source/drain layer 120 and a silicon-germanium channel 131 can be in the range of approximately defect free to $1 \times 10^6$ defects/cm$^2$ at the interface. There can be fewer traps/defects at the channel-drain interface compared to the channel-source interface.

In one or more embodiments, the tunneling current between a silicon top source/drain segment 200 or a silicon bottom source/drain layer 120 and a silicon-germanium channel 131 can be in the range of $1 \times 10^{-9}$ A/um (micrometer) to about $1 \times 10^{-10}$ A/um, where a silicon drain—silicon-germanium (20 at. % Ge) channel can have a tunneling current of at least about $1 \times 10^{-10}$ A/um, and a silicon-germanium (20 at. % Ge) channel—silicon-germanium (60 at. % Ge) drain can have a tunneling current of at least about $1 \times 10^{-9}$ A/um.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a device and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming a vertical transport fin field effect transistor, comprising:
    forming a bottom source/drain layer at the surface of the substrate, wherein the bottom source/drain layer is silicon-germanium having a germanium concentration in the range of about 40 at. % Ge to about 80 at. % Ge;
    forming one or more channels on the bottom source/drain layer, where the channels extend away from the bottom source/drain layer;
    forming a gate structure on each of the one or more channels; and
    forming a top source/drain segment on the top surface of each of the one or more channels, wherein each of the top source/drain segments is silicon, and each of the top source/drain segments has a larger bandgap than the bottom source/drain layer.

2. The method of claim 1, wherein each of the top source/drain segments has a bandgap in the range of about 1.0 eV to about 1.2 eV, and the bottom source/drain layer has a bandgap in the range of about 0.7 eV to about 0.9 eV.

3. The method of claim 1, wherein the bottom source/drain layer and each of the top source/drain segments is doped with boron, gallium, or indium.

4. The method of claim 3, wherein each of the top source/drain segments is formed by an epitaxial growth process on the top surface of each of the one or more channels.

5. The method of claim 1, wherein the bottom source/drain layer and each of the top source/drain segments is doped with phosphorus, arsenic, or antimony.

6. The method of claim 5, wherein the bottom source/drain layer is doped using ion implantation, gas phase doping, plasma doping, plasma immersion ion implantation, cluster doping, infusion doping, liquid phase doping, solid phase doping, or combinations thereof.

7. The method of claim 5, wherein the bottom source/drain layer is formed by an epitaxial growth process on the substrate.

8. The method of claim 7, wherein the bottom source/drain layer is formed by vapor phase epitaxy (VPE), ion beam epitaxy (IBE), ultrahigh vacuum chemical vapor deposition (UHVCVD), rapid thermal chemical vapor deposition (RTCVD), metalorganic chemical vapor deposition (MOCVD), low-pressure chemical vapor deposition (LP-CVD), limited reaction processing chemical vapor deposition (LRPCVD), molecular beam epitaxy (MBE), liquid-phase epitaxy (LPE), or combinations thereof.

9. A method of forming a vertical transport fin field effect transistor, comprising:
   forming a bottom source/drain layer at the surface of the substrate;
   forming one or more channels on the bottom source/drain layer, where the channels extend away from the bottom source/drain layer;
   forming a gate structure on each of the one or more channels; and
   forming a top source/drain segment on the top surface of each of the one or more channels, where each of the top source/drain segments is silicon-germanium having a germanium concentration in the range of about 40 at. % Ge to about 80 at. % Ge.

10. The method of claim 9, wherein the bottom source/drain layer is doped to a concentration in the range of about $5 \times 10^{18}$ to about $3 \times 10^{21}$ atoms/cm$^3$.

11. The method of claim 10, wherein the bottom source/drain layer is doped with boron, gallium, or indium by ion implantation, gas phase doping, plasma doping, plasma immersion ion implantation, cluster doping, infusion doping, liquid phase doping, solid phase doping, or combinations thereof.

12. The method of claim 9, further comprising forming an extension region from the bottom source/drain layer below each of the one or more channels on the bottom source/drain layer.

13. The method of claim 9, further comprising forming a top spacer on the gate structures.

14. A vertical transport fin field effect transistor, comprising:
   a bottom source/drain layer at the surface of the substrate;
   one or more channels on the bottom source/drain layer, where the channels extend away from the bottom source/drain layer;
   an extension region between each of the one or more channels and the bottom source/drain layer;
   a gate structure on each of the one or more channels; and
   a top source/drain segment on the top surface of each of the one or more channels, wherein either each of the top source/drain segments or the bottom source/drain layer has a bandgap in the range of about 1.0 eV to about 1.2 eV, and the other of the bottom source/drain layer or each of the top source/drain segments has a bandgap in the range of about 0.7 eV to about 0.9 eV.

15. The vertical transport fin field effect transistor of claim 14, wherein the bottom source/drain layer has a thickness in the range of about 10 nm to about 50 nm.

16. The vertical transport fin field effect transistor of claim 14, wherein the top source/drain segments have a height in the range of about 10 nm to about 100 mn.

17. The vertical transport fin field effect transistor of claim 14, wherein the channel layer is silicon-germanium with a germanium concentration in the range of about 10 at. % Ge to about 40 at. % Ge.

18. The vertical transport fin field effect transistor of claim 14, wherein the extension regions have a height in the range of about 1 nm to about 20 nm.

* * * * *